US009360968B2

(12) United States Patent
Wright

(10) Patent No.: US 9,360,968 B2
(45) Date of Patent: Jun. 7, 2016

(54) CURSOR CONTROL DEVICE AND METHOD OF OPERATION

(75) Inventor: David Wright, San Diego, CA (US)

(73) Assignee: CYPRESS SEMICONDUCTOR CORPORATION, San Jose, CA (US)

(*) Notice: Subject to any disclaimer, the term of this patent is extended or adjusted under 35 U.S.C. 154(b) by 1713 days.

(21) Appl. No.: 12/036,090

(22) Filed: Feb. 22, 2008

(65) Prior Publication Data

US 2008/0204409 A1 Aug. 28, 2008

Related U.S. Application Data

(60) Provisional application No. 60/891,207, filed on Feb. 22, 2007.

(51) Int. Cl.
G06F 3/033 (2013.01)
G06F 3/044 (2006.01)
G06F 3/02 (2006.01)
H03K 17/96 (2006.01)
H03K 17/98 (2006.01)

(52) U.S. Cl.
CPC ............. *G06F 3/044* (2013.01); *G06F 3/0202* (2013.01); *H03K 17/9622* (2013.01); *H03K 17/98* (2013.01); *H03K 2217/960755* (2013.01)

(58) Field of Classification Search
CPC ..... G06F 3/033; G06F 3/0334; G06F 3/0338; G06F 3/044; G06F 3/0202; G06F 3/0213; G06F 1/169; G06F 1/3259; H03K 17/98; H03K 17/9622; H03K 2217/960755
USPC .................... 345/156–177; 178/18.01–19.03
See application file for complete search history.

(56) References Cited

U.S. PATENT DOCUMENTS

| 2,611,051 | A | | 9/1952 | Kolff |
| 4,347,478 | A | * | 8/1982 | Heerens et al. ............... 324/661 |
| 4,584,625 | A | * | 4/1986 | Kellogg ..................... 361/283.1 |
| 4,604,584 | A | | 8/1986 | Kelley |
| 5,949,354 | A | * | 9/1999 | Chang ............................. 341/33 |
| 6,067,862 | A | | 5/2000 | Murray et al. |
| 6,115,030 | A | * | 9/2000 | Berstis et al. ................. 345/161 |
| 6,442,812 | B1 | * | 9/2002 | Kovacich .................. G01L 1/16 156/293 |
| 2002/0122025 | A1 | * | 9/2002 | Suzuki et al. ................. 345/157 |
| 2004/0255697 | A1 | * | 12/2004 | Okada ...................... 73/862.043 |
| 2005/0156881 | A1 | * | 7/2005 | Trent, Jr. ............. G06F 3/03547 345/157 |
| 2005/0253643 | A1 | | 11/2005 | Inokawa et al. |
| 2006/0169060 | A1 | * | 8/2006 | Okada ...................... 73/862.043 |
| 2006/0267933 | A1 | * | 11/2006 | Tai et al. ....................... 345/157 |
| 2007/0057167 | A1 | * | 3/2007 | MacKey et al. ............... 250/221 |

OTHER PUBLICATIONS

United States Patent and Trademark Office; PCT Search Report dated Jun. 27, 2008; 2 Pages.
Written Opinion of the International Searching Authority for International Application No. PCT/US2008/054781 mailed Jun. 27, 2008; 4 pages.

* cited by examiner

*Primary Examiner* — Rodney Amadiz

(57) ABSTRACT

We describe an apparatus including a plurality of sensing elements, a conductive layer, and a compressive layer interposed between the plurality of sensing elements and the conductive layer. The conductive layer can include a plurality of segments. A user applies a force to an actuator positioned over the conductive layer. The actuator changes a capacitance of at least one capacitor formed by at least one of the plurality of sensing elements, the conductive layer (at least one segment), and the compressive layer by reducing the distance between the at least one of the plurality of sensing elements and the conductive layer responsive to the applied force. The device measures and calculates a magnitude and direction of the force by measuring the change in the capacitance.

18 Claims, 3 Drawing Sheets

(TOP VIEW)

(CROSS-SECTION VIEW)

(SIDE VIEW)

Figure 2b (TOP VIEW)

(CROSS-SECTION VIEW)

(CROSS-SECTION VIEW)

(SIDE VIEW)

CURSOR CONTROL DEVICE AND METHOD OF OPERATION

We claim priority to and incorporate by reference U.S. provisional patent application Ser. No. 60/891,207 filed Feb. 22, 2007.

FIELD

This invention relates generally to a control device, and more specifically, to a cursor control device and method.

BACKGROUND

Actuators and buttons have found recent widespread use in a variety of applications including remote controls and controllers associated with gaming consoles like the Sony® PlayStation® and Microsoft® Xbox®. A remote control or game controller can include one or more control assemblies. The control assemblies, in turn, include actuators and circuitry to convert a mechanical movement applied to the actuator by a user into an electrical signal. Directional pads (D-pads) are one example of control assemblies found on nearly all modern game controllers. D-pads typically comprise a substantially circular control surface, pivoted in the center and coupled to four buttons or switches associated with corresponding four primary directions.

FIGS. 1a and 1b illustrate a D-pad 100 used in a remote control 102 and a game controller 104, respectively. The D-pad 100 includes four buttons 106a-d and 108a-d associated with corresponding Up, Down, Right, and Left primary directions. To define secondary directions more easily, we will alternatively refer to the Up, Down, Left, and Right primary directions as North (N), South (S), East (E), and West (W), respectively. The compass points are merely used here as a convenience to define the directions and do not refer to actual compass points or cardinal directions.

Depressing the button 106a in the Up or N direction, for example, closes the underlying switch generating a corresponding electronic signal provided to the D-pad's circuitry (not shown). Similarly and for another example, depressing button 106b in the Down or S direction closes the underlying switch generating a corresponding electronic signal and providing it to the D-pad's circuitry (not shown). Simultaneously depressing both button 106a in the Up and N direction and button 106b in the Left or W direction closes both underlying switches, generating a corresponding electronic signal. The D-pad can sense movement in four primary directions (Up or N, Down or S, Right or E, and Left or W) and in four secondary directions (NE, NW, SE, and SW). The D-pad can sense movement in the four secondary directions when a user depresses two buttons. For example, the D-pad would determine movement in the NW direction when a user depresses both the Up or N and Left or W buttons.

D-pads 100 are relatively inexpensive to manufacture but typically lack angular resolution better than 45 degrees. And D-pads 100 do not measure the depression force with which the user presses the buttons 106a-d and 108a-d. If the D-pad 100 could measure the depression force, this could be used to control the rate of a cursor's movement.

To control the rate of a cursor's movement, some game controllers use a strain gauge or a force sensing resistor (FSR) to sense a force applied to the cursor buttons. An example of a FSR device is the IBM Trackpoint®, a small red button found on IBM® laptops. Similar FSR devices are in use in several other applications. FSR devices offer the advantage of providing control of both the direction and speed of cursor motion (which is a function of the depression force with which the user presses the buttons) in a relatively small form factor, and direction resolution is much improved compared with a D-pad. Although capable of providing excellent cursor control in a relatively small form factor, strain gauges or FSR devices are expensive to manufacture.

DRAWINGS

FIG. 2b illustrates a top view of sensing element traces for the cursor control device shown in FIG. 2a.

FIG. 5 illustrates an embodiment of a 3-plate capacitor for the cursor control device of FIG. 2a.

DETAILED DESCRIPTION

Figure 1A:
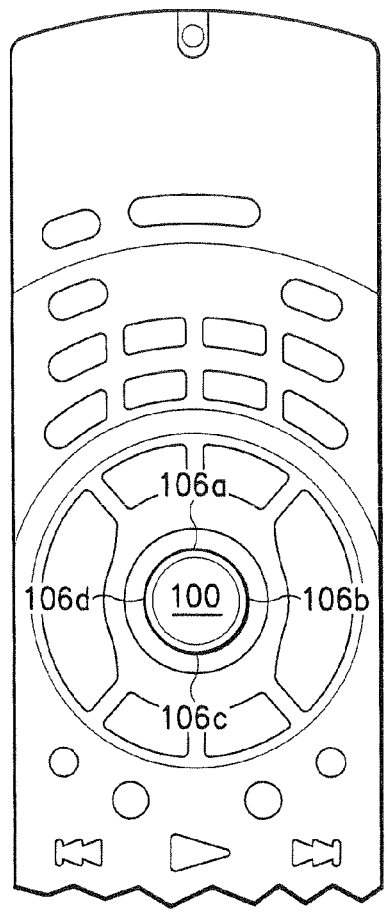
FIGS. 1a and 1b illustrate a remote control and a game controller, respectively.
Figure 1B:
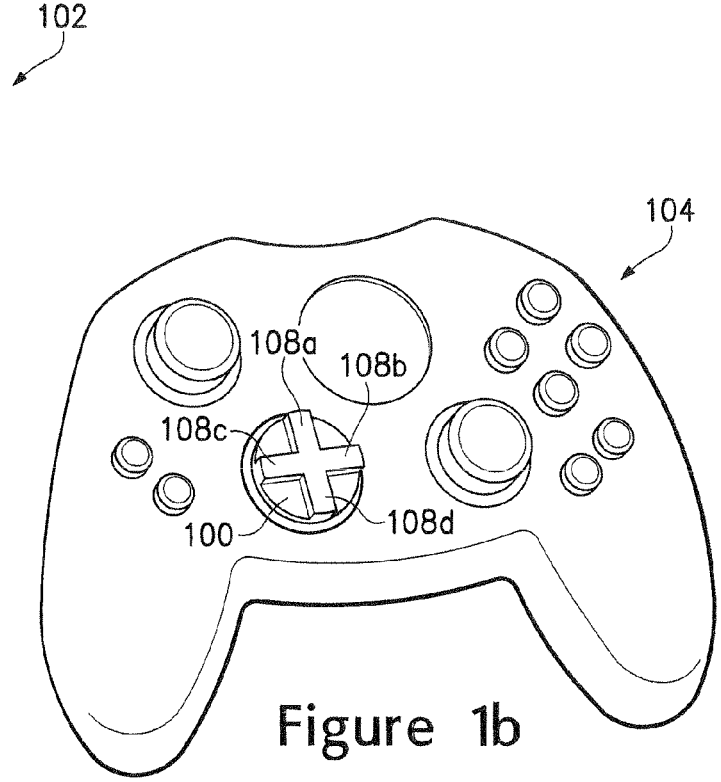
Figure 2A:
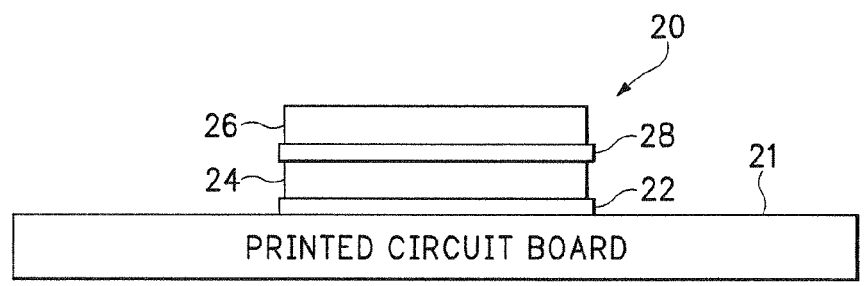
FIG. 2a illustrates a side view of an embodiment of a cursor control device.

FIG. 2a illustrates a side view of an embodiment of a cursor control device 20. FIG. 2b illustrates a top view of sensing element traces for the cursor control device shown in FIG. 2a.

Referring to FIG. 2a, the cursor control device 20 includes a printed circuit board (PCB) 21 with a plurality of sensing elements 22. In an embodiment, the plurality of sensing elements 22 are arranged in a ring or circular manner as shown in FIG. 2b. Each of the plurality of sensing elements can be traces on the PCB 21. A non-conductive compressive layer 24 stacks or overlays on the plurality of sensing elements 22. Any suitable non-conductive or dielectric compressive material can make up the compressive layer 24, e.g., rubber or high-density foam. A conductive layer 28 stacks over the compressive layer 24. Any suitable conductive material can make up the conductive layer 28 including copper foil. An actuator 26 stacks on the conductive layer 28. A user (not shown) applies a force to the actuator 26 that, in turn, compresses the compressive layer 24 through the conductive layer 28 changing the distance and hence, the capacitance between the conductive layer 28 and one or more of the plurality of 20 sensing elements 22. In one embodiment, the conductive layer 28 may be a PCB trace and the actuator 26 may be a PCB substrate. In another embodiment, the device 20 can include multiple actuators 26 stacked on top of each other. In yet another embodiment, the conductive layer 28 may be a printed conductive ink (such as silver or carbon-impregnated ink) applied to the underside of actuator 26. In yet another embodiment, the conductive layer 28 may be a single 25 conductor covering all of the plurality of elements 22; in another implementation, the conductive layer 28 may be segmented similarly to the plurality of elements 22, or in such a way that a single segment overlaps two or more of the elements 22.

Figure 3:
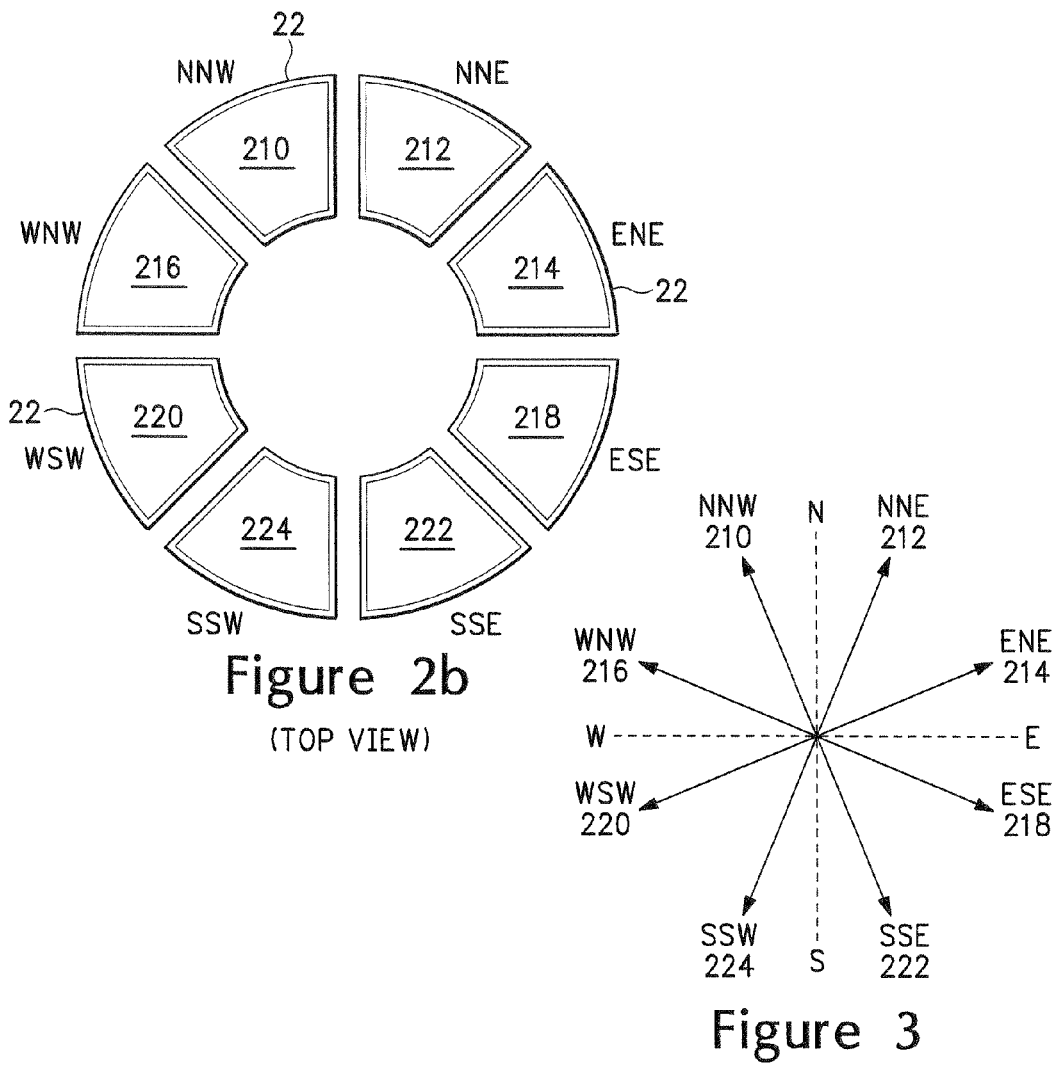
FIG. 3 illustrates the directions used to identify the sensing elements of FIGS. 2a and 2b.

The plurality of sensing elements 22 could include any number of elements with three elements being a minimum for full 360 degrees sensing. The device can include less than three elements 22 if the angle to be sensed is less than a full 360 degrees. In one embodiment, the plurality of sensing elements 22 may include eight elements arranged in a circular or ring manner as shown in FIG. 2b. FIG. 3 illustrates the directions used to identify the sensing elements of FIGS. 2a and 2b. Each of the plurality of elements 22 can associate with corresponding directions including North-North-East (NNE) 212, North-North-West (NNW) 210, East-North-East (ENE) 214, West-North-West (WNW) 216, East-South-East (ESE) 218, West-South-West (WSW) 220, South-South-East (SSE) 222, and South-South-West (SSW) 224, as shown in FIGS. 2b and 3. Note again that the compass points are merely used here as a convenience to define the directions and do not refer to actual compass points. For example, N does not actually point to the cardinal point North but rather refers generally to the Up direction.

The cursor control device 20 calculates a measure of either direction or magnitude of a force applied by a user to the actuator 26 using a difference in capacitance. The difference in capacitance is a reflection of a distance change between a first set of conductive plates or layers (e.g., conductive layer 28) and a second plate or set of plates (e.g., the plurality of segments 22).

In an embodiment, each sensing element forms a capacitor with the conductive layer 28, the compressive layer 24 serving as a dielectric. The conductive layer 28 can connect to ground, or may be unconnected to any electrical voltage in the system.

When the actuator 26 is at rest (i.e., not depressed), the capacitance between each of the sensing elements 22 and the conductive layer 28 (e.g., at ground potential) is relatively small but may be useful to calibrate the cursor control device 20.

When the user (not shown) applies a force to depress the actuator 26, the actuator 26 is active. The force will compress the compressive layer 24, changing the vertical distance between the conductive layer 24 and one or more of the sensing elements 22 located in the direction of the force. The change in vertical distance, in turn, increases the capacitance to ground for the capacitor formed between the conductive layer 28 and the one or more sensing elements 22 aligned along the direction of the force. The device 20, therefore, can determine the direction of the force on the actuator 26 by measuring the capacitance change of the one or more capacitors formed by corresponding one or more of the plurality of segments 22 responsive to the user's application of force to the actuator 26. Put differently, the device 20 can generate a signal indicating a desired movement direction for a cursor (not shown) on a display (not shown) by measuring or sensing a capacitance change that lies along the direction of the force applied by the user on the actuator 26. This direction may be calculated by interpolating between the detected capacitance of two or more of the segments 22 in the 210-224 directions and ground.

For example, if the user activates the actuator 26 by applying a force on the north edge, the device 20 can measure the increase in capacitance in the NNW and NNE sensing elements 22. If the device 20 measures the change in capacitance as equal in both NNW and NNE directions, the device 20 will determine that the user applied the force in the N direction (between the NNW and NNE directions). Similarly, if the device 20 measures the change in capacitances as greater in the NNW sensing element, the device 20 will determine the user applied the force in a direction closer to NNW than NNE, the precise angle being calculated in a manner derived from the ratio of the two capacitances.

In an embodiment, the device 20 can measure the magnitude of the force applied to the actuator 26 to generate a signal indicating a desired rate of movement for the cursor on the display. The device 20 can measure the magnitude of the force by summing the capacitance change for at least two of the plurality of sensing elements 22. Alternatively, the device 20 can determine the magnitude of the force by calculating a difference between a sensing element 22 with a most capacitance change and a sensing element 22 with a least capacitance change. Another alternative is for the device 20 to determine the magnitude of the force by determining a difference in capacitance for a sensing element having one of either a most capacitance change or a least capacitive change. Yet another alternative is for the device 20 to determine the magnitude of the force by comparing the capacitance of the at least one capacitor to a capacitance of all other capacitors. A person of reasonable skill in the art can envision other methods of calculating or otherwise determining the magnitude of the force on the actuator 26.

Figure 4:
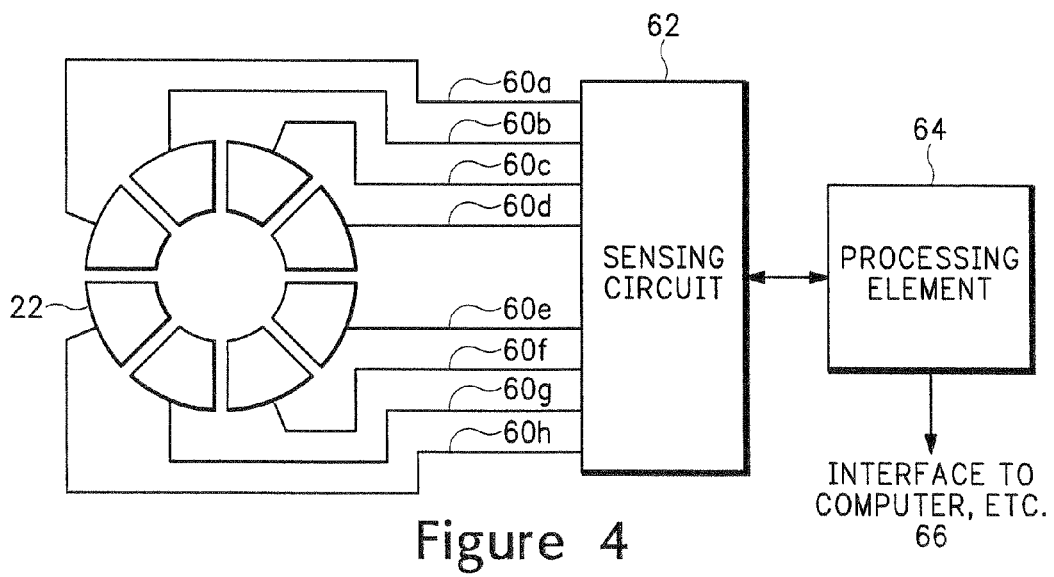
FIG. 4 illustrates an embodiment of a capacitance sensing circuit connected to the plurality of sensing elements shown in FIGS. 2a and 2b.

FIG. 4 illustrates an embodiment of a capacitance sensing circuit connected to the plurality of sensing elements 22 shown in FIGS. 2a and 2b. Referring to FIG. 4, a sensing circuit 62 electrically couples to each of the plurality of sensing elements 22. The sensing circuit 62 can measure the capacitance change for each of the plurality of sensing elements 22 through terminals 60a-h responsive to actuation (or activation) of the actuator 26 by application of a force. The sensing circuit 62 can measure the capacitance between each of the sensing elements 22 and ground. In this example of eight sensing elements, sensing circuit 62 may be implemented as a single sensing circuit coupled to an 8:1 multiplexor, or eight individual sensing circuits, or two sensing circuits each coupled to a 4:1 multiplexor, and the like. The sensing circuit 62 can include an inexpensive microprocessor control unit (MCU) that is capable of accurately and reliably detecting very small changes in capacitance. The MCU can be any one of the PSoC® mixed signal controllers manufactured by Cypress Semiconductor®. A processing element 64 receives a numerical measure of the capacitance change associated with the sensing elements 22 from the sensing circuit 62. The processing element 64 calculates the direction of the force on the actuator 26 and generates a signal indicating a desired movement direction for the cursor on the display. The processing element 64 calculates the magnitude of the force and generates a signal indicating a desired rate of movement for the cursor on the display. The processing element 64 can transmit the signal indicating movement direction and transmit the signal indicating rate of movement of the cursor on the display to a computer via the interface 66.

In one embodiment, the processing element 64 continuously receives capacitance values from the sensing circuit 62, and calculates the direction and magnitude of the force from these values.

In an embodiment, the processing element 64 may periodically signal to the sensing circuit 62 to make a set of capacitance measurements. Between periodic measurements, the processing element 64 and the sensing circuit 62 may be in a low power mode to save power. The sensing circuit 62 can make capacitance measurements continuously or at predetermined periods, e.g., every 8 ms. The processing element 64 calculates a measure of the direction and magnitude of the force applied to the actuator 26 each time the sensing circuit 62 makes a capacitance measurement. In an embodiment, the processing element 64 provides the calculations to a downstream computer (not shown) via the interface 66. Alternatively, the processing element 64 can provide conventional cursor movement signals representing a pair of x and y direction values, to the downstream computer (not shown) via the interface 66. In an embodiment, a game software program (not shown) stored in the downstream computer uses the calculated direction and magnitude of the force applied to the actuator 26 or alternatively, the cursor signals, to move a cursor in a corresponding direction and at a corresponding rate or speed.

Figure 5:
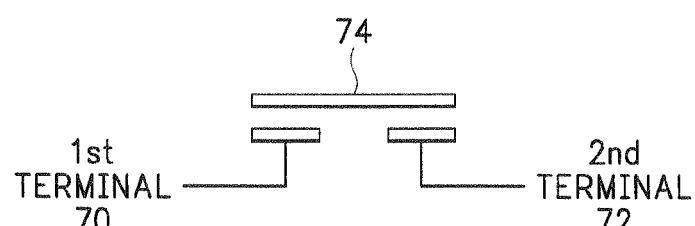

FIG. 5 illustrates an embodiment of a 3-plate capacitor for the cursor control device of FIG. 2*a*. Referring to FIGS. 2*a* and 5, the 3-plate capacitor can include a pair of adjacent sensing elements 22 and the conductive layer 28 shown in the cursor control device 20 of FIG. 2*a* (plate 74 in FIG. 5). The pair of adjacent sensing elements 22 are coupled to the sensing circuit 62 (FIG. 4) via terminals 70 and 72. In an embodiment, the conductive layer 28 floats, i.e., not electrically coupled to a potential, forming an array of 3-plate capacitors with the plurality of sensing elements 22. The sensing circuit 62 reads the capacitance of a selected sensing element 22 by applying a ground voltage to all of the elements 22 not user selected and measuring the capacitance to ground of the element that is user selected.

Figure 6:
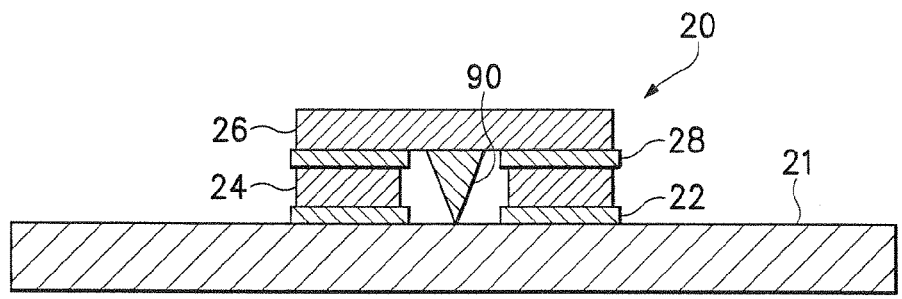
FIG. 6 illustrates an embodiment of an actuator of FIG. 2a, with a pivot attached.

FIG. 6 illustrates an embodiment of an actuator of FIG. 2*a*, with a pivot attached. The actuator 26 can have a variety of shapes and sizes. In an embodiment, the actuator 26 includes a pivot 90 that allows the actuator 26 to rock in any number of directions.

Figure 7:
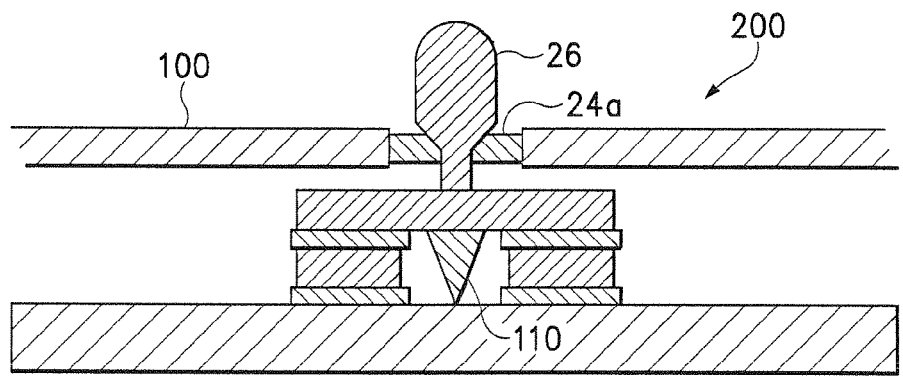
FIG. 7 illustrates another embodiment of the actuator.

FIG. 7 illustrates another embodiment of the actuator 26. Referring to FIGS. 2*a* and 7, an enclosure 100 encloses or surrounds portions of the device 20. In an embodiment, only a top portion of the actuator 26 may be outside the enclosure 100 and accessible to the user. In an embodiment, a compressive layer 24*a* exists between the actuator 26 and the enclosure 100. The compressive layer 24*a* provides resistance to movement of the actuator 26 and results in a larger force than an embodiment not including the compressive layer 24*a*. A larger force will create a greater reduction in the distance between the conductive layer 28 and the plurality of segments 22, resulting in a greater increase in capacitance. In another embodiment, the compressive layer 24 or 24*a* includes springs. The springs, in turn, can be located between the actuator 26 and the enclosure 100 or, alternatively, between the actuator 26 and the conductive layer 28.

Figure 8:
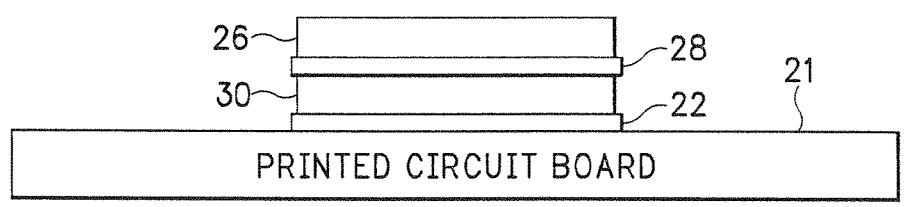
FIG. 8 illustrates a side view of an embodiment of a cursor control device.

FIG. 8 illustrates a side view of an embodiment of a cursor control device. Referring FIG. 8, an air gap 30 replaces the compressive layer 24 shown in FIG. 2*a* between the conductive layer 28 and the plurality of segments 22. The air gap 30 can be air as the name implies, or an appropriate fluid.

One of skill in the art will recognize that the concepts taught herein are capable of tailoring to a particular application in many other advantageous ways. In particular, those skilled in the art will recognize that the illustrated embodiments are but one of many alternative implementations that will become apparent upon reading this disclosure. For instance, the plurality of sensing elements 22 may include more or fewer than the eight elements shown in the drawings depending on the application. Using more elements may result in a more accurate directional calculation, but at the cost of requiring more inputs to the capacitance sensing circuit 62. We have described the present in terms of its application for cursor control, but can also be applied for other purposes, e.g., movement control or direction of view control in computer gaming, menu item selection in a display menu, camera field of view control, radio controlled model control, audio balance/fade control, and the like.

A person of reasonable skill in the art can make changes to the embodiments in form and detail without departing from the spirit and scope of the following claims.

The invention claimed is:

1. An apparatus comprising:
a plurality of sensing elements comprising at least eight sensing elements oriented in a ring-like pattern around a center axis, the center axis oriented perpendicular to the plurality of sensing elements, wherein the plurality of sensing elements are coupled to a sensing circuit;
a conductive element, coupled to a ground voltage, to form a capacitor with each of the plurality of sensing elements, wherein the sensing circuit is configured to measure a capacitance of each of the capacitors formed by the conductive element and the plurality of sensing elements;
a compressive layer comprising a non-conductive compressive material stacked between the plurality of sensing elements and the conductive element; and
an actuator coupled to the conductive element, the actuator configured to allow movement in a plurality of directions to change the capacitance of each of the capacitors formed by the conductive element and the plurality of sensing elements, wherein a radial angle of the movement of the actuator relative the center axis is determined with angular resolution greater than forty-five degrees by using a ratio of two of the capacitances of adjacent capacitors comprised by the capacitors formed by the conductive element and the plurality of sensing elements, and wherein a magnitude of a force of the movement is determined using the change in the capacitances.

2. The apparatus of claim 1, wherein the plurality of sensing elements are configured to be adjacent to one another in the ring-like pattern.

3. The apparatus of claim 1, wherein the plurality of sensing elements comprises only eight sensing elements.

4. The apparatus of claim 1, wherein the conductive element comprises copper foil.

5. The apparatus of claim 1, wherein the compressive layer comprises at least one of a foam layer or a rubber layer.

6. The apparatus of claim 1, wherein the actuator is configured to change the capacitance of each of the capacitors formed by the conductive element and the plurality of sensing elements by changing a distance between the conductive element and the plurality of sensing elements.

7. The apparatus of claim 1, wherein the actuator comprises a substantially circular disk enclosed on a top by an enclosure and on a bottom by a printed circuit board.

8. The apparatus of claim 1, further comprising the sensing circuit to measure the change in the capacitance of each of the capacitors formed by the conductive element and the plurality of sensing elements.

9. The apparatus of claim 8, wherein the sensing circuit is configured to measure the change in capacitance of each of the capacitors formed by the conductive element and the plurality of sensing elements either continuously or at periodic intervals.

10. The apparatus of claim 1, further comprising a processing element to calculate the magnitude of the force applied by a user to the actuator by summing the change in at least two of the capacitances.

11. The apparatus of claim 1, further comprising a processing element to calculate the magnitude of the force applied by a user to the actuator by calculating a difference between a sensing element of the plurality of sensing elements with a most capacitance change and a sensing element of the plurality of sensing elements with a least capacitance change.

12. The apparatus of claim 1, further comprising a processing element to calculate the magnitude of the force applied by a user to the actuator by determining a difference in capacitance for a sensing element of the plurality of sensing elements having one of either a most capacitance change or a least capacitive change.

13. A method of controlling a cursor on a display, the method comprising:

establishing at least eight capacitors oriented in a ring-like pattern around a center axis, the center axis oriented perpendicular to a plurality of sensing elements comprised by the at least eight capacitors, wherein the at least eight capacitors are established by interposing a compressive dielectric layer between a conductive layer and the plurality of sensing elements, wherein the compressive layer comprises a non-conductive compressive material, wherein the conductive layer is coupled to a ground voltage and forms a capacitor with each the plurality of sensing elements, and wherein the plurality of sensing elements are coupled to a sensing circuit that is configured to measure the a capacitance of each of the capacitors established by the conductive layer and the plurality of sensing elements; and changing the capacitance of each the capacitors established by the conductive layer and the plurality of sensing elements by moving an actuator overlaid on the conductive layer in at least one of a plurality of directions, wherein a radial angle of the movement of the actuator relative the center axis is determined with angular resolution greater than forty-five degrees by using a ratio of two of the capacitances of adjacent capacitors comprised by the capacitors established by the conductive layer and the plurality of sensing elements, and wherein a magnitude of a force is determined by using the change in the capacitances.

14. The method of claim 13, wherein changing the capacitance of each of the capacitors established by the conductive layer and the plurality of sensing elements comprises changing a distance between the conductive layer and the plurality of sensing elements.

15. The method of claim 13, wherein changing the capacitance of each of the capacitors established by the conductive layer and the plurality of sensing elements comprises applying a compressive force to the actuator that results in compressing the compressive dielectric layer.

16. The method of claim 13, further comprising measuring the capacitance of each of the capacitors established by the conductive layer and the plurality of sensing elements.

17. The method of claim 13, further comprising determining the magnitude of the force by calculating a difference between a sensing element of the plurality of sensing elements with a most capacitance change and a sensing element of the plurality of sensing elements with a least capacitance change.

18. The method of claim 13, further comprising determining the magnitude of the force by determining a difference in capacitance for a sensing element of the plurality of sensing elements having one of either a most capacitance change or a least capacitive change.

* * * * *